(12) United States Patent
Frankowsky (10) Patent No.: US 7,427,870 B2
(45) Date of Patent: Sep. 23, 2008

(54) TEST SYSTEM FOR TESTING INTEGRATED CIRCUITS AND A METHOD FOR CONFIGURING A TEST SYSTEM

(75) Inventor: Gerd Frankowsky, Hoehenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 59 days.

(21) Appl. No.: 11/347,809

(22) Filed: Feb. 3, 2006

(65) Prior Publication Data

US 2006/0198211 A1    Sep. 7, 2006

(30) Foreign Application Priority Data

Feb. 4, 2005    (DE) .................. 10 2005 005 101

(51) Int. Cl.
*G01R 31/26* (2006.01)
(52) U.S. Cl. ...................................... 324/765
(58) Field of Classification Search .................. 324/765
See application file for complete search history.

(56) References Cited

U.S. PATENT DOCUMENTS 6,043,672 A * 3/2000 Sugasawara ................ 324/765
6,411,116 B1 * 6/2002 DeHaven et al. ............ 324/765
6,791,344 B2 * 9/2004 Cook et al. .................. 324/754
2002/0190707 A1 * 12/2002 Farnworth et al. ........ 324/158.1

FOREIGN PATENT DOCUMENTS

DE    10133261 A1    1/2003
DE    10202904 A1    9/2003

* cited by examiner

*Primary Examiner*—Vinh P Nguyen
(74) *Attorney, Agent, or Firm*—Patterson & Sheridan, L.L.P.

(57) ABSTRACT

The invention relates to a test system for testing connectable integrated circuits. A particular test system may have switching devices via which a respective assigned one of the integrated circuits can be connected to the supply unit, a control unit for controlling the switching devices, and a determination unit in order to determine an item of information about a power consumption of an integrated circuit to be measured. The control unit, depending on the information, may switch the switching device in order to connect the integrated circuit to be measured to the supply unit or to isolate it from the supply unit.

21 Claims, 5 Drawing Sheets

TEST SYSTEM FOR TESTING INTEGRATED CIRCUITS AND A METHOD FOR CONFIGURING A TEST SYSTEM

CROSS-REFERENCE TO RELATED APPLICATIONS

This application claims foreign priority benefits under 35 U.S.C. §119 to co-pending German patent application number DE 10 2005 005 101.4, filed 4 Feb. 2005. This related patent application is herein incorporated by reference in its entirety.

BACKGROUND OF THE INVENTION

1. Field of the Invention

The invention relates to a test system for testing connectable integrated circuits in particular a method for configuring a test system.

2. Description of the Related Art

Semiconductor components are usually tested in parallel, that is to say that a plurality of components are connected to a test system in parallel via test channels and tested simultaneously with identical test patterns. The components to be tested in parallel are usually connected to a common current supply. If an excessively large current flows through one of the components on account of a defect, e.g. on account of an internal short circuit or the like, then this could lead to a voltage drop on the supply lines and the supply of the remaining functional components to be tested would no longer be ensured, and so the latter would be assessed as defective.

In order to avoid this, each component can be connected to its own voltage supply unit, a large number of supply units being required particularly in the case of test applications in which a very large number of integrated components are to be tested in parallel, e.g. during the wafer level burn-in. This approach is very complicated and causes very high costs.

SUMMARY OF THE INVENTION

Therefore, an embodiment of the present invention provides a test system in which the number of supply units for supplying a large number of integrated components that are to be tested simultaneously can be reduced without the risk of the supply voltage of one of the supply units dropping on account of an excessively large current flow through one of the integrated components, or the supply unit being damaged or failing and the testing of the integrated components thus being delayed or prevented. Another embodiment of the present invention provides a method for configuring a test system in which the supply units of the test system are connected to the integrated circuits in a suitable manner without the test system being impaired on account of defective integrated circuits that require an excessively high supply current.

A first aspect of the present invention provides a test system for testing connectable integrated circuits. The test system has a supply unit for supplying the integrated circuits. Provision is furthermore made of switching devices via which the integrated circuits can be connected to the supply unit in a switchable manner. The switching devices are controlled with the aid of a control unit. A determination unit is provided in order to determine an item of information about a power consumption of an integrated circuit to be measured. The control unit switches the switching device depending on the information, so that the integrated circuit to be measured is connected to the supply unit or is isolated from the latter.

The test system has the advantage over a test system in accordance with the prior art that only one supply unit for provision of a supply voltage has to be provided, to which the integrated circuits can be jointly connected. In order to avoid the situation in which defected integrated circuits with a current consumption that is excessively high with respect to a specification are also connected to the supply unit during testing, the test system, with the aid of the determination unit, checks for each of the integrated circuits to be measured whether the current consumption thereof lies within a defined range or whether the current consumption exceeds a threshold value. Depending on this information, the control unit switches each switching device assigned to the respective integrated circuit in such a way that only the integrated circuits whose power consumption does not indicate a defect of said integrated circuit, in particular a short circuit, are connected to the supply unit.

The determination unit may, in an analog manner, carry out the comparison of a current through the circuit to be measured with a maximum permissible current and generates the information depending on the result of the threshold value comparison. As an alternative, it is possible for the determination unit in a digital manner to measure a current value of the current through the circuit to be measured, compare it with a maximum permissible current value and generate the information depending on the difference between the measured current value and the maximum permissible current value.

In one embodiment of the invention, the control unit may be configured in such a way that it successively selects each of the integrated circuits in order to apply the voltage supply to the corresponding integrated circuit via the assigned switching device, in order to determine the information about the power consumption with the aid of the determination unit. Afterward, the selected integrated circuit is isolated from the supply unit with the aid of the switching device and the information about the power consumption or current consumption for the switching devices thus checked is stored in a memory unit. For testing, the control unit connects each of the integrated circuits to the supply unit via the switching device depending on the items of information stored in the memory unit. That is to say that only those integrated circuits whose power consumption does not exceed a maximum value are connected to the supply unit. This constitutes a possibility, firstly by individually checking the power consumption of each of the integrated circuits to be tested which are connected to the test system, of ascertaining which integrated circuits are defective. Afterward, only those integrated circuits whose power consumption does not indicate a defect, such as e.g. a short circuit, are coupled to the supply unit.

As an alternative, the test system may be configured in such a way that the control unit successively selects each of the integrated circuits in order to connect the corresponding integrated circuit to the supply unit via the assigned switching device, to determine the information about the power consumption of the integrated circuit with the aid of the determination unit and subsequently to isolate the selected integrated circuit from the supply unit with the aid of the switching device depending on the information about the power consumption or to cause the integrated circuit to be connected to the supply unit. In this regard, a threshold value generating circuit may be provided, which generates a threshold value for the power consumption depending on the number of integrated circuits presently connected to the supply unit, the determination unit determining the information about the power consumption of the selected integrated circuits by means of a threshold value comparison of the total power consumption of the integrated circuits connected via the switching devices and the threshold value generated for the power consumption. This embodiment of the test system has the advantage that a memory unit for storing the information about the power consumption can be dispensed with since the integrated circuits are successively connected to the supply unit. If it is ascertained that the integrated circuit connected up last brings about an excessively large current flow in the supply units, the integrated circuit connected last is isolated from the supply unit again.

In accordance with one preferred embodiment, the switching devices may be configured so as to connect a respective one of the integrated circuits to the supply unit or to a further supply unit, the control unit switching the switching device depending on the information in order to connect the assigned integrated circuit to be measured either to the supply unit or to the further supply unit. This embodiment has the advantage that a voltage is applied also to the supply terminals of those integrated circuits which have an excessively large current consumption on account of a defect. This is necessary particularly in the case of integrated circuits whose signal inputs have an ESD protection device and the like or whose signal inputs, with a supply voltage not applied, do not remain at high impedance if an electrical voltage signal is applied. By providing a further supply unit, however, it is possible to reduce or avoid the current consumption in the integrated circuits via the signal terminals for signal inputs which are jointly connected to the tester channels.

It may be provided that the test system provides tester channels for connection to a respective signal input of the integrated circuit, a supply voltage of the further supply unit being chosen in such a way that when those integrated circuits which are connected to the further supply unit via the switching devices are supplied, essentially no current flows via the respective tester channel.

A further aspect of the present invention provides a method for configuring a test system to which integrated circuits can be connected and which has a supply unit for supplying the integrated circuits. The method comprises the steps of detecting an item of information about the power consumption of each of the integrated circuits, and of connecting the respective integrated circuit to the supply unit depending on the detected information about the power consumption of the respective integrated circuit.

The method has the advantage that prior to the beginning of testing, each of the integrated circuits is checked with regard to its current consumption and the integrated circuit is connected to the supply unit only when the power consumption does not indicate a defect of the integrated circuit.

In particular, it is provided in accordance with a preferred embodiment that a respective one of the integrated circuits is connected to the supply unit or to a further supply unit depending on the information about the power consumption. In particular, a supply voltage of the further supply unit may be selected, so that when those integrated circuits which are connected to the further supply unit are supplied, essentially no current flows via tester channels which are connected to signal inputs of the integrated circuit connected to the further supply unit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Preferred embodiments of the present invention are explained in more detail below with reference to the accompanying drawings in which.

DETAILED DESCRIPTION OF THE PREFERRED EMBODIMENT

Figure 1:
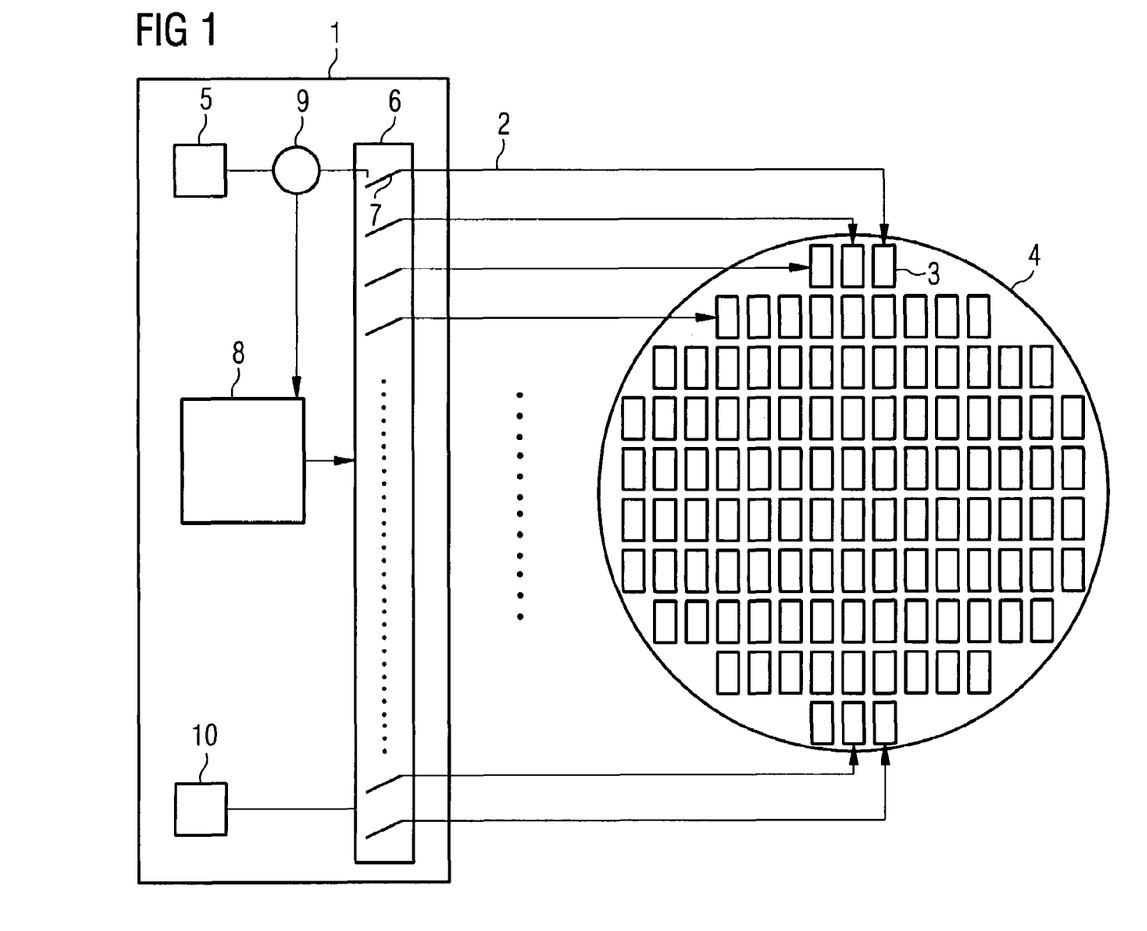
FIG. 1 shows a schematic illustration of a test system with connecting lines to a wafer substrate on which integrated circuits to be tested are situated.

FIG. 1 illustrates a test system 1 according to the present invention. The test system 1 is connected via supply and signal lines to integrated components 3 to be tested, which are situated on a wafer substrate 4. The invention can likewise be applied to test systems in which the integrated components 3 to be tested are situated on a test board and have already been housed. The test system 1 is a test system by means of which the integrated components 3 are intended to be tested in parallel, the test system 1 applying the supply voltages and the test signals in parallel to all the connected integrated components 3.

The supply and signal lines 2 are connected to the integrated components 3 for example via a contact-making card (not shown), the contact-making card usually having contact-making elements that are placed onto contact areas of the integrated components 3.

The test system 1 has a first supply source 5, which, via a measuring unit 9 described later, makes available a first supply voltage, which is required for the operation of the integrated components 3, in the test system 1. The first supply voltage 5 is applied to a switching unit 6, which connects or isolates each of the integrated components 3 to or from the first supply voltage via the corresponding supply lines (in the supply and signal lines 2). For this purpose, the switching unit 6 has a switch 7 for each of the supply lines. The switching states of the switches 7 are set by a control unit 8 connected to the switching unit 6. A measuring unit 9 is provided between the first supply source 5 and the switching unit 6, which measuring unit measures the current flow from the supply source 5 and communicates the result of the measurement to the control unit 8.

Furthermore, a second supply source 10 is provided, which is likewise connected to the switching unit 6. Depending on the switching state of each of the switches 7 assigned to the integrated components 3, either the first supply source 5 or the second supply source 10 is connected to the associated integrated component 3 via the corresponding supply line. In this case, the switches 7 are preferably formed as changeover switches between the first and second supply sources 5, 10.

Figure 2:
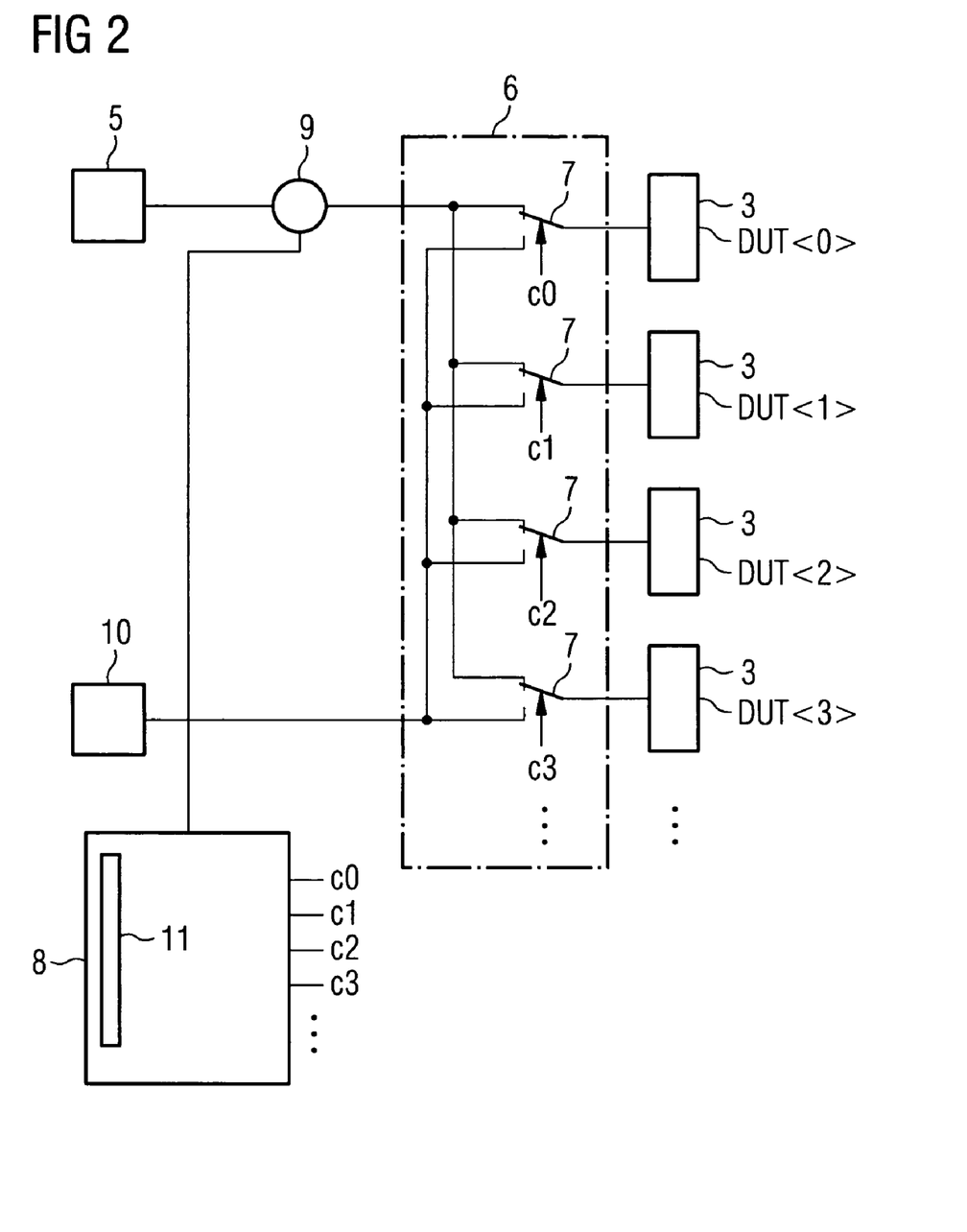
FIG. 2 shows a circuit detail from a test system with a plurality of integrated circuits to be tested in accordance with one embodiment of the present invention.

FIG. 2 illustrates a detail from the circuit in the test system, on the basis of which the functioning of the method according to the invention for configuring the test system is described. The integrated components 3 to be tested can essentially be subdivided into integrated components 3 which have a normal power consumption and defective integrated components having an increased power consumption. In order to avoid the situation in which, when a defective integrated component 3 is connected to the first supply source 5, the first supply source 5 is loaded excessively or undergoes a failure, the invention provides for first ascertaining the power consumption of the individual integrated components 3. On the basis of the power consumption determined, a check is made to establish whether or not the integrated component 3 to be tested ought to be connected to the first supply source 5. If it is ascertained that the power consumption lies above a threshold value that is assumed to be a maximum for the power consumption, the corresponding integrated component is not connected to the first supply source 5, but rather to the second supply source 10. During the subsequent testing of the integrated components 3, however, only the integrated components 3 connected to the first supply source 5 are tested with regard to their function, since the other integrated components 3 are defective anyway on account of their increased power consumption and are generally not utilized.

A possible method according to which the control unit 8 determines the power consumption of each individual integrated component 3 to be tested and then sets the switching state of the corresponding switch is effected as follows: in accordance with a first embodiment, the control unit 8 firstly drives a first one of the switches 7 with the aid of the control signal c0 and thus connects a first one of the integrated components DUT(0) to the first supply source 5. Afterward, the measuring unit 9 measures the current flowing in the first integrated component DUT(0) and checks whether the integrated component is defective, for example on the basis of a threshold value comparison, that is to say e.g. by comparison with a maximum permissible current. If the integrated component DUT(0) is identified as not defective, this is indicated by an error datum stored in a memory unit 11, which is situated in the control unit 8 in the exemplary embodiment illustrated. It goes without saying that the memory unit 11 may also be arranged outside the control unit 8 in the test system 1. If the first integrated component DUT(0) is identified as defective, that is to say it has an excessively large power consumption, it is likewise indicated in an error datum stored in the memory unit 11. The control unit 8 then again switches the switch assigned to the first component DUT(0) in such a way that the second supply source 10 is connected to the first integrated component DUT(0). Next, a switch 7 assigned to a second one of the integrated components DUT (1) is switched in accordance with the control signal c1 in order to isolate the second integrated component DUT(1) from the second supply source 10 and to connect it to the first supply source 5. A measurement of the current through the second integrated component DUT(1) is once again carried out and, with the aid of the threshold value comparison, it is ascertained whether or not the power consumption of the second integrated component DUT(1) exceeds a maximum permissible power consumption. The result of this threshold value comparison is then likewise stored in a memory area of the memory unit 11 assigned to the second integrated component DUT(1). This method is carried out successively for all the integrated components DUT which are connected to the test system 1, in order to store the assigned error data as the items of information about the current consumption of each of the integrated components in the memory unit. If all of the integrated components connected to the test system 1 have been checked, the control signals c0, c1, c2, c3, etc. are applied, according to the content of the memory unit 11, to the switches 7 assigned to the integrated components in order to connect all the integrated components whose power consumptions lie below a maximum value to the first supply source 5 and to connect—or cause to be connected—all the remaining integrated components DUT, which were determined as defective during the threshold value comparison, to the second supply source 10.

The second supply source 10 is merely optionally to be provided. As mentioned in the introduction, the integrated components 3 are connected to the test system 1 not only for the supply lines but also with signal lines. Signal lines transmit signals in the form of voltage levels to the test system. Particularly in the case of a high level, it can happen, when supply voltage is not present at the integrated component to be tested, that a high current flows from the assigned signal driver via the signal line when a high level is present. This is the case particularly for integrated components whose signal input terminals have ESD protection diodes or other devices which serve to afford protection against overvoltages at the relevant signal input terminal. That is to say that if no voltage is present at the supply terminal, irrespective of whether or not the integrated component is defective, this may have the effect that a high current flows via the signal lines which are situated between the test system and the relevant integrated component and usually cannot be turned off individually. Since the signal inputs of all the integrated components to be tested jointly are often driven via a signal generator, the increased current flow into a signal input terminal of a defective integrated component may have the effect that the driver for the corresponding signal is damaged, or that the voltage level of the high level is not reached since the current driver capability of the signal driver is exceeded. This would considerably impair or prevent the testing of the integrated circuit. This can be avoided, however, by applying, instead of the first supply voltage, a second supply voltage, which is an auxiliary voltage, to the integrated components 3 which are not intended to be connected to the first supply source 5. What is achieved in this way is that the signal inputs of the defective integrated components are biased and cannot draw an increased current from the corresponding signal drivers of the test system 1.

In the case where the defective integrated components do not take up an increased current through the signal input terminals even when an integrated supply voltage is not present, the provision of the second supply source 10 can be dispensed with.

Figure 3:
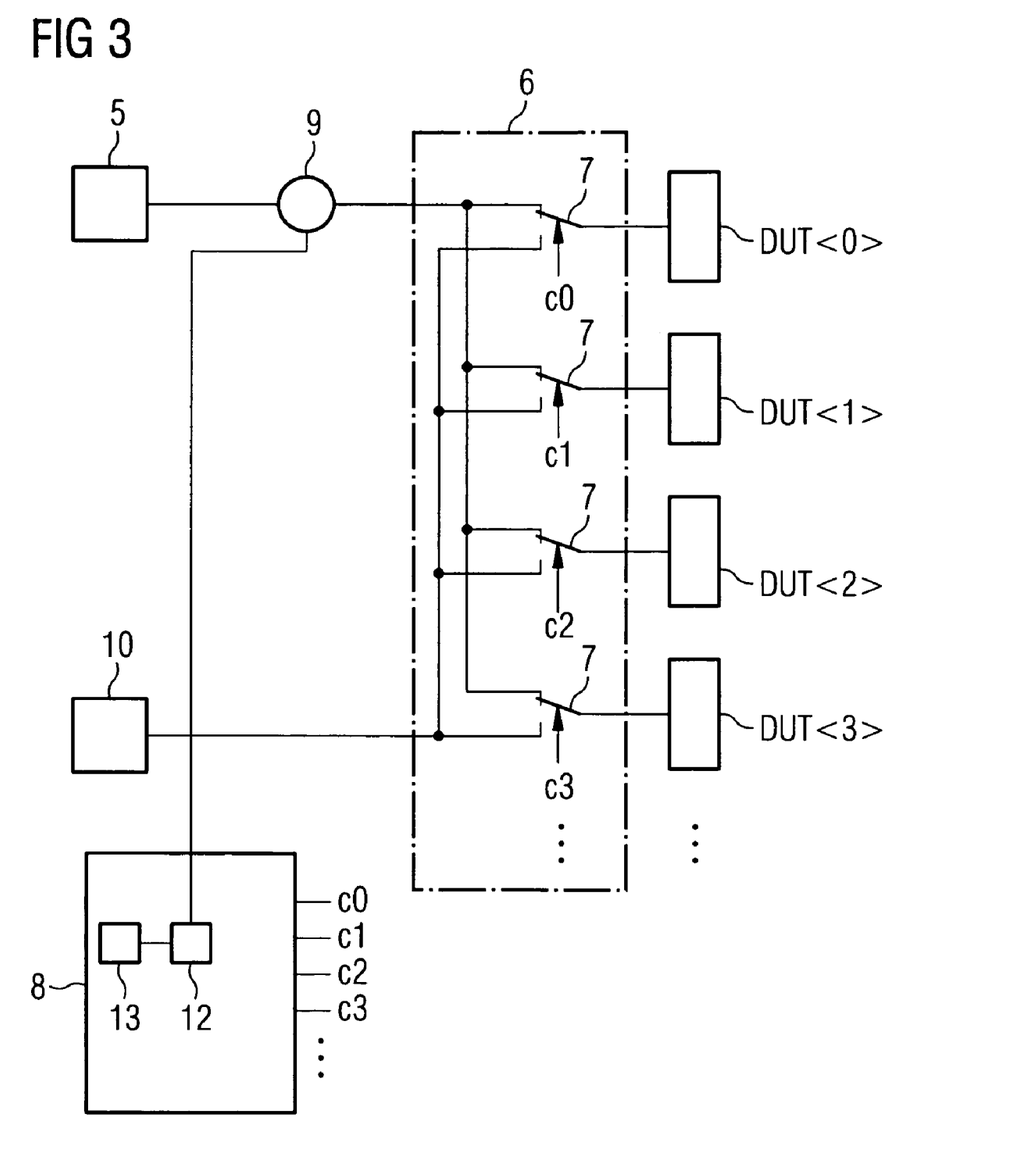
FIG. 3 shows a circuit detail from a test system with a plurality of integrated circuits to be tested in accordance with a further embodiment of the present invention.

The configuration of the test system which is to be used subsequently to carry out a test with those integrated components 3 whose power consumption is not increased may alternatively be performed by means of a further method of the invention. This method operates with a test system such as can be gathered from the detail in FIG. 3. In this case, identical reference symbols represent elements having an identical function. Instead of a memory unit 11, in this embodiment the control unit 8 has a threshold value comparison circuit 12 connected to a threshold value generator circuit 13. Firstly, each of the switches 7 of the switching unit is initially set in such a way that the integrated circuits 3 are connected to the second supply source 10. The switch 7 assigned to the first integrated component DUT(0) is then driven by the control unit 8 in order to connect the integrated component DUT(0) to the first supply source 5. The current through the measuring unit 9 is then measured and compared with a threshold value in the comparator unit 12, which is generated by the threshold value generator circuit 13. The integrated component DUT is then isolated again from the first supply source 5 only when it is ascertained in the comparator unit 12 that the power consumption of the first integrated component DUT(0) is greater than is prescribed by the threshold value provided. Otherwise, the switching state of the switch 7 remains unchanged, and the first integrated component DUT(0) can remain connected to the first supply source 5. Afterward, the switch 7 assigned to the second integrated component DUT(1) is switched in such a way that the second integrated component DUT(1) is connected to the first supply source 5. The current flowing into the first and second integrated components DUT(0), DUT(1) is measured by the measuring unit 9 and compared with a further threshold value, generated in the threshold value generator circuit 13, in the comparator unit 12. The threshold value generator circuit 13 generates a threshold value depending on the present number of the integrated components that have already been connected to the first supply source. This is usually realized with the aid of a counter in the control unit 8, which counts the number of control signals with which the switches 7 are driven in such a way that they connect the integrated components to the first supply source 5.

Figure 4:
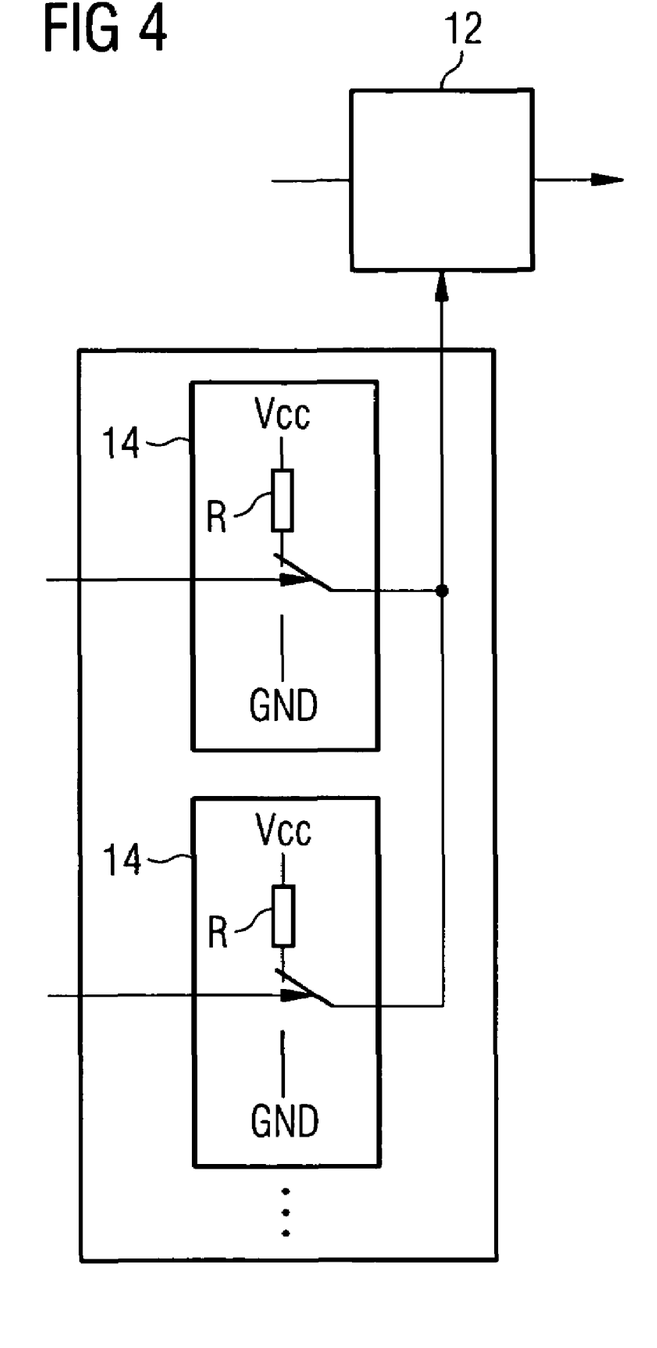
FIG. 4 shows a detail for realizing a threshold value comparison in accordance with a further embodiment of the invention.

FIG. 4 illustrates an embodiment of the threshold value generator circuit 13 and of the comparator unit 12. The threshold value generator circuit 13 has individual switchable voltage sources 14 which can be individually connected up or disconnected in order to apply a corresponding threshold value signal in the form of a voltage or a current to an input of the comparator unit 12. If the voltage sources 14 are connected in parallel and their outputs are thus connected to the input of the comparator 12, then the threshold value is applied to the comparator 12 as a voltage signal that results from the input resistance of the comparator unit 12 and the resistances R of the switchable voltage source 14. What is essential in the case of the threshold value generator circuit is that, under the control of the control unit 8, a threshold value signal in the form of a voltage or current is applied to an input of the comparator unit 12, the threshold value corresponding to the present counter value specifying the number of integrated components presently connected to the first supply source. That is to say that the threshold value may correspond to a magnitude for the current which results from a value for the average current consumption of the integrated components connected to the first supply voltage in the case of the present counter number.

The individual integrated components are gradually connected to the first supply source 5 in this way and isolated again from the latter only when the threshold value comparison with the threshold value, which is altered when each new integrated component is connected up, yields an excessively increased current consumption of the integrated component connected up last. After the last integrated component has been checked, the switching states of the switches 7 are then fixed, and the testing can be begun immediately after this configuration cycle.

Figure 5:
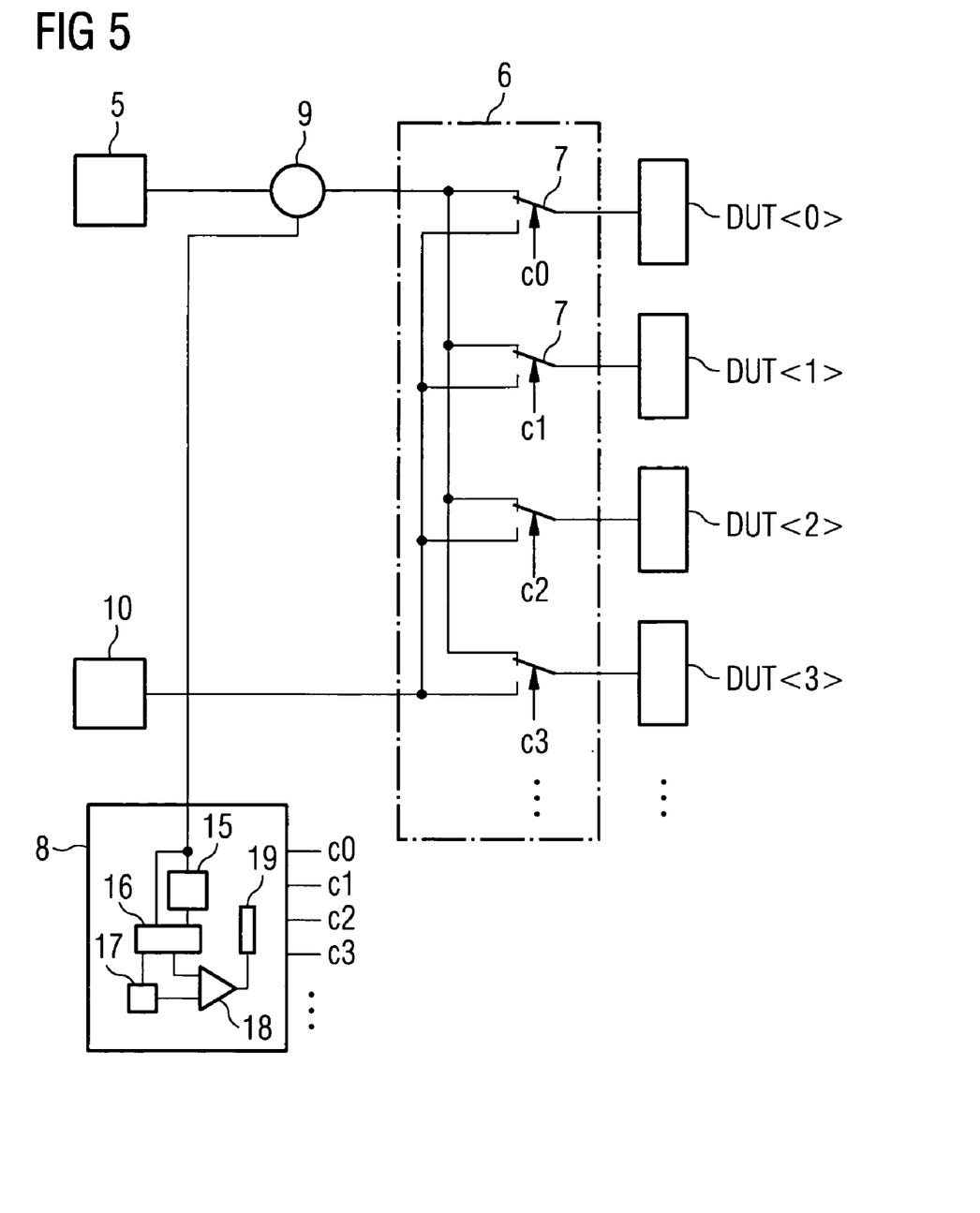
FIG. 5 shows a circuit detail from a test system with a plurality of integrated circuits to be tested in accordance with another embodiment of the present invention.

As an alternative, as shown in FIG. 5, it may be provided that the control unit 8 has a measured value memory 15 in order to store the current through the measuring unit 9 as current value. For this purpose, firstly a first switch 7, controlled by a switch controller 19, is closed and the current through the measuring unit 9 is measured. The measured current is stored in the measurement memory. After the measurement of the current through the switch 7 assigned to the first integrated component DUT(0), the switch 7 assigned to a second integrated component DUT(1) is switched in such a way that the second integrated component DUT(1) is connected to the first supply source 5. The current is again measured through the measuring unit 9 and a difference between the current value previously stored in the measured value memory 19 and the current value measured anew is determined in a difference unit 16. The current difference is compared with a threshold current value, generated by a threshold value generator circuit 17, in a comparator 18. If the difference between the two measured current values exceeds the threshold current value generated by the threshold value generator circuit 17, then the switch 7 that was closed last is opened again under the control of the switch controller 19 since it has been ascertained that the integrated component DUT(1) connected via said switch has an excessively high power consumption. Otherwise, the switch 7 that was closed last remains closed. The threshold current value is chosen in such a way that it corresponds to the maximum permissible current consumption of one of the integrated components. This procedure is repeated for each of the switches.

This alternative embodiment avoids the situation in which the threshold value generator circuit 17 has to generate the threshold value depending on the integrated circuits connected to the first supply source 5. Instead, a measured value memory 15 is provided, which stores the current value prior to the switching of one of the switches 7 and, after the switching of the switch 7, that is to say the connection of the assigned integrated component to the first supply source 5, forms the difference between the stored current value and the current value now flowing through the measuring unit 9 and compares the difference with the current threshold value. This carried out for all of the integrated components.

While the foregoing is directed to embodiments of the present invention, other and further embodiments of the invention may be devised without departing from the basic scope thereof, and the scope thereof is determined by the claims that follow.

What is claimed is:

1. A test system for testing connectable integrated circuits, comprising:
   a supply unit for supplying an electrical signal to the integrated circuits;
   a switching device comprising a plurality of switches configured to selectively connect the integrated circuits to the supply unit;
   a single determination unit configured to determine an item of information about a power consumption of any integrated circuit to be tested;
   a threshold value generating circuit configured to generate a threshold value for the power consumption depending on a number of integrated circuits connected to the supply unit, and wherein the determination unit generates the item of information about the power consumption of each integrated circuit by comparing a value of the total power consumption of the integrated circuits connected via the switching device and the generated threshold value; and
   a control unit for controlling the switches; wherein the control unit, depending on the item of information, switches the switches in order to connect the integrated circuit to be tested to the supply unit or to isolate it from the supply unit during testing.

2. The test system of claim 1, wherein the determination unit is configured to:
   perform a comparison of a current through the integrated circuit to be tested with a maximum permissible current; and
   generate the item of information depending on the result of the comparison.

3. The test system of claim 1, wherein the determination unit is configured to:

measure a current value of the current through the integrated circuit to be tested;

compare the measured current value with a maximum permissible current value; and generate the item of information depending on a difference between the measured current value and the maximum permissible current value.

4. The test system of claim 1, wherein the control unit is configured to successively connect each of the integrated circuits to the supply unit via a respective switch of the plurality of switches.

5. The test system of claim 1, wherein the control unit is configured to successively connect and disconnect each of the integrated circuits to the supply unit via a respective switches of the plurality of switches.

6. The test system of claim 1, wherein the control unit is configured to:

store the item of information about the power consumption for each of the integrated circuits in a memory unit; and during testing of the integrated circuits, connect each of the integrated circuits to the supply unit via their respective switch depending on the items of information stored in the memory unit.

7. The test system of claim 1, wherein the control unit is configured to:

operate the determination unit and the plurality of switches to determine which integrated circuits are defective by operating the respective switches to successively connect each integrated circuit to the supply unit and then receiving a measurement signal from the determination unit reflective of the item of information; and depending on the item of information for the selected integrated circuit, operate the respective switch for the selected integrated circuit to isolate the selected integrated circuit from the supply unit or leave the selected integrated circuit connected the supply unit.

8. A test system for testing connectable integrated circuits, comprising:

a supply unit for supplying an electrical signal to the integrated circuits;

a switching device comprising a plurality of switches configured to selectively connect the integrated circuits to the supply unit;

a single determination unit configured to determine an item of information about a power consumption of any integrated circuit to be tested;

a control unit for controlling the switches; wherein the control unit, depending on the item of information, switches the switches in order to connect the integrated circuit to be tested to the supply unit or to isolate it from the supply unit during testing; and another supply unit for providing a voltage; wherein the control unit is configured to operate the switching device so as to connect a respective one of the integrated circuits to the supply unit or to the other supply unit depending on the item of information for the respective integrated circuit.

9. The test system of claim 8, further comprising:

a plurality of tester channels for connection to a respective signal input of the integrated circuits;

wherein substantially no current flows via the respective tester channel for those integrated circuits connected to the other supply unit via the switching device.

10. A method for configuring a test system for the testing of integrated circuits, the test system comprising a single determination unit, the method comprising:

(a) for each of a plurality of integrated circuits:

coupling an integrated circuit to a voltage supply;

using the determination unit of the test system to measure a current consumed by the integrated circuit while the integrated circuit is coupled to the voltage supply;

determining whether the integrated circuit is defective based on the measured current;

decoupling the integrated circuit from the voltage supply;

(b) coupling only those integrated circuits determined not to be defective to the voltage supply; and then (c) testing the integrated circuits coupled to the voltage supply; and (d) coupling the integrated circuits determined to be defective to a different voltage supply while testing the integrated circuits determined not to be defective.

11. The method of claim 10, further comprising leaving the integrated circuits determined to be defective decoupled from the voltage supply while testing the integrated circuits determined not to be defective.

12. The method of claim 10, wherein the integrated circuits are formed on a wafer.

13. The method of claim 10, wherein steps (a)-(c) are performed by a testing unit coupled to the integrated circuits via supply and signal lines.

14. A method for configuring a test system to which integrated circuits can be connected, the test system comprising a single determination unit, the method comprising:

using the determination unit of the test system to detect an item of information about the power consumption of each of the integrated circuits, wherein detecting the item of information about the power consumption of each of the integrated circuits is effected successively for each of the integrated circuits and wherein detecting the item of information about the power consumption of each of the intecirated circuits comprises:

determining a difference between a measured current value of an immediately previously selected integrated circuit to a measured current value of a currently selected integrated circuit; and comparing the difference to a predetermined current value; and connecting the respective integrated circuit to a supply unit depending on the detected item of information about the power consumption of the respective integrated circuit.

15. The method of claim 14, wherein detecting the item of information about the power consumption of each of the integrated circuits comprises:

comparing a measured current through the integrated circuit with a maximum permissible current; and generating the item of information depending on the results of the comparison.

16. The method of claim 14, wherein detecting the item of information about the power consumption of each of the integrated circuits comprises:

measuring a current value of the current through the integrated circuit;

comparing the measured current value with a maximum permissible current value; and generating the item of information depending on a difference between the measured current value and the maximum permissible current value.

17. The method of claim 14, wherein detecting the item of information about the power consumption of each of the integrated circuits is effected successively for each of the integrated circuits and further comprising:

after the detecting of a respective integrated circuit, isolating the respective integrated circuit from the supply unit; and storing the item of information about the power consumption of the respective integrated circuit.

18. The method of claim 14, further comprising isolating the currently selected integrated circuit from the supply unit depending on the comparison.

19. A method for configuring a test system to which integrated circuits can be connected, the test system comprising a single determination unit, the method comprising:

using the determination unit of the test system to detect an item of information about the power consumption of each of the integrated circuits;

connecting the respective integrated circuit to a supply unit depending on the detected item of information about the power consumption of the respective integrated circuit;

generating a threshold value for the power consumption depending on a number of integrated circuits connected to the supply unit;

determining the total power consumption of all the integrated circuits connected to the supply unit; and determining the item of information about the power consumption by carrying out a comparison of the determined total power consumption and a predefined threshold value for the power consumption.

20. The method of claim 19, further comprising:

connecting a respective one of the integrated circuits to one of the supply unit and another supply unit depending on the item of information about the power consumption.

21. The method of claim 20, wherein substantially no current flows via tester channels to those integrated circuits connected to the other the supply unit.

* * * * *

UNITED STATES PATENT AND TRADEMARK OFFICE
CERTIFICATE OF CORRECTION

PATENT NO.         : 7,427,870 B2                                                        Page 1 of 1
APPLICATION NO.   : 11/347809
DATED              : September 23, 2008
INVENTOR(S)        : Gerd Frankowsky It is certified that error appears in the above-identified patent and that said Letters Patent is hereby corrected as shown below:

Column 10, Line 36, in Claim 14, please delete "intecirated" and insert therefor --integrated--.

Signed and Sealed this

Fifth Day of May, 2009

JOHN DOLL
*Acting Director of the United States Patent and Trademark Office*